US012713914B2

(12) United States Patent
Hazra et al.

(10) Patent No.: US 12,713,914 B2
(45) **Date of Patent: *Aug. 18, 2026**

(54) STRUCTURED MICROCHANNEL COOLING TECHNOLOGY BY UTILIZING A NOVEL HARD MASK PATTERN TRANSFER FABRICATION PROCESS

(71) Applicant: The Board of Trustees of the Leland Stanford Junior University, Stanford, CA (US)

(72) Inventors: Sougata Hazra, Stanford, CA (US); Mehdi Asheghi, Oakland, CA (US); Kenneth E. Goodson, Portola Valley, CA (US)

(73) Assignee: The Board of Trustees of the Leland Stanford Junior University, Stanford, CA (US)

(*) Notice: Subject to any disclaimer, the term of this patent is extended or adjusted under 35 U.S.C. 154(b) by 125 days.

This patent is subject to a terminal disclaimer.

(21) Appl. No.: 18/196,800

(22) Filed: May 12, 2023

(65) Prior Publication Data

US 2023/0317548 A1 Oct. 5, 2023

Related U.S. Application Data

(63) Continuation-in-part of application No. 18/129,657, filed on Mar. 31, 2023.

(Continued)

(51) Int. Cl.

| | |
|---|---|
| ***H10W 40/22*** | (2026.01) |
| ***H10W 40/47*** | (2026.01) |
| ***H10W 70/02*** | (2026.01) |

(52) U.S. Cl.

CPC ......... *H10W 40/226* (2026.01); *H10W 40/22* (2026.01); *H10W 40/47* (2026.01); *H10W 70/02* (2026.01)

(58) Field of Classification Search

CPC ............... H01L 23/315; H01L 23/3672; H01L 23/3675; H01L 23/427; H01L 23/473; H01L 21/4871; H01L 21/4882; H05K 7/20254; H05K 7/20272; H05K 7/327; H05K 7/336; F28F 3/022; F28F 9/22;

(Continued)

(56) References Cited

U.S. PATENT DOCUMENTS 5,835,345 A * 11/1998 Staskus .............. H05K 7/20254 174/15.1
10,306,802 B1 * 5/2019 Ditri ................... H01L 23/4735

(Continued)

FOREIGN PATENT DOCUMENTS

DE 102011089891 A1 * 6/2013 ......... H01L 23/3677

OTHER PUBLICATIONS

DE-102011089891-A1 English Translation (Year: 2013).*

*Primary Examiner* — Amir A Jalali
(74) *Attorney, Agent, or Firm* — LUMEN PATENT FIRM

(57) ABSTRACT

Improved microchannel structures are provided using monolithic structures having deep features (≥150 um) and two or more different feature heights above the substrate. Exemplary channel structures that are enabled by this approach include step-tapered V-groove channels, channels having various kinds of lithographically define roughness, and channels having an arbitrarily defined depth along their length.

12 Claims, 16 Drawing Sheets

Related U.S. Application Data

(60) Provisional application No. 63/341,706, filed on May 13, 2022, provisional application No. 63/326,109, filed on Mar. 31, 2022.

(58) Field of Classification Search
CPC ...... F28F 13/02; F28F 13/185; F28F 2255/08; F28F 2260/00; F28D 15/02
See application file for complete search history.

(56) References Cited

U.S. PATENT DOCUMENTS

| | | | | |
|---|---|---|---|---|
| 11,081,424 | B2 * | 8/2021 | Bonam | F28F 3/12 |
| 11,592,241 | B2 * | 2/2023 | Nicholas | G21C 15/02 |
| 11,980,011 | B2 * | 5/2024 | Edmunds | H05K 7/20254 |
| 12,041,759 | B2 * | 7/2024 | Inam | H02J 3/1842 |
| 2004/0104012 | A1 * | 6/2004 | Zhou | H01L 23/427<br>257/E23.088 |
| 2004/0188066 | A1 * | 9/2004 | Upadhya | F28F 3/02<br>257/E23.098 |
| 2008/0308884 | A1 * | 12/2008 | Kalvesten | B81B 7/0061<br>438/49 |
| 2010/0132923 | A1 * | 6/2010 | Batty | F28D 15/0233<br>165/104.26 |
| 2016/0033212 | A1 * | 2/2016 | Wang | F28F 13/187<br>165/104.21 |
| 2017/0092565 | A1 * | 3/2017 | Chen | H05K 7/20281 |
| 2017/0094837 | A1 * | 3/2017 | Joshi | H05K 7/20327 |
| 2018/0031330 | A1 * | 2/2018 | Roberts | F28D 15/046 |
| 2019/0385931 | A1 * | 12/2019 | Eid | H01L 23/3677 |
| 2023/0197448 | A1 * | 6/2023 | Zhang | H01L 21/31144<br>438/689 |
| 2023/0317548 | A1 * | 10/2023 | Hazra | H01L 23/3738<br>361/697 |

* cited by examiner 202
214
210
208
206
204
212

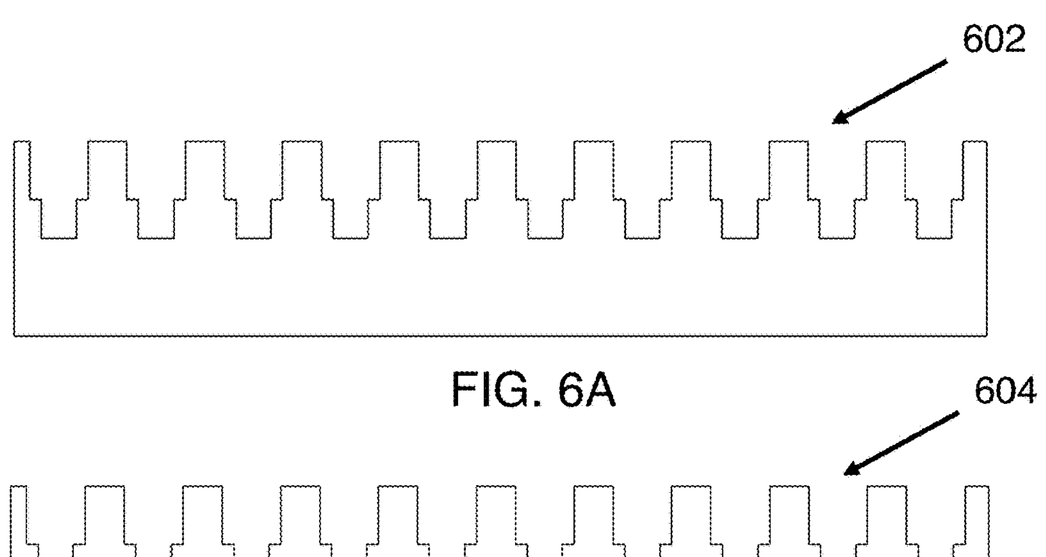
FIG. 6A
FIG. 6B
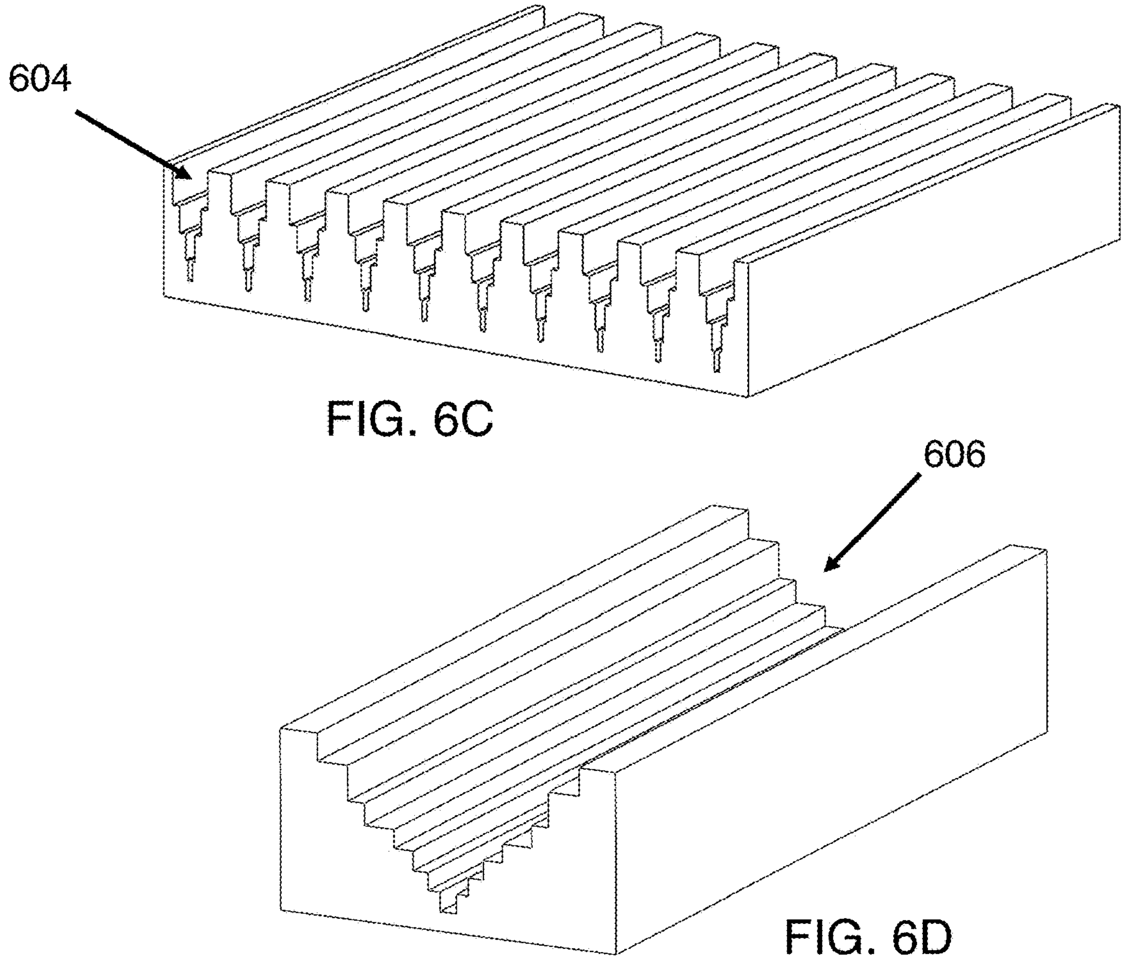
FIG. 6C
FIG. 6D

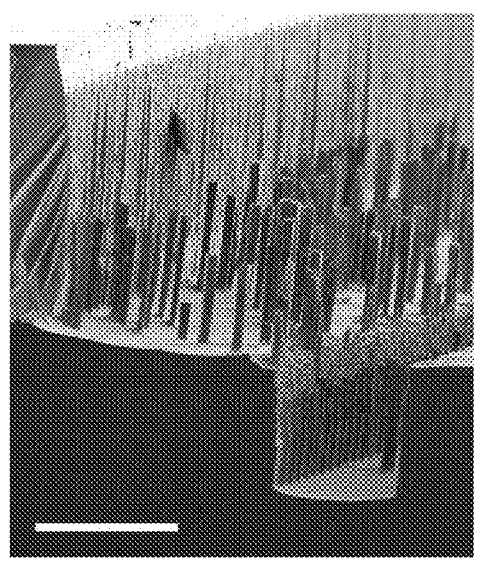
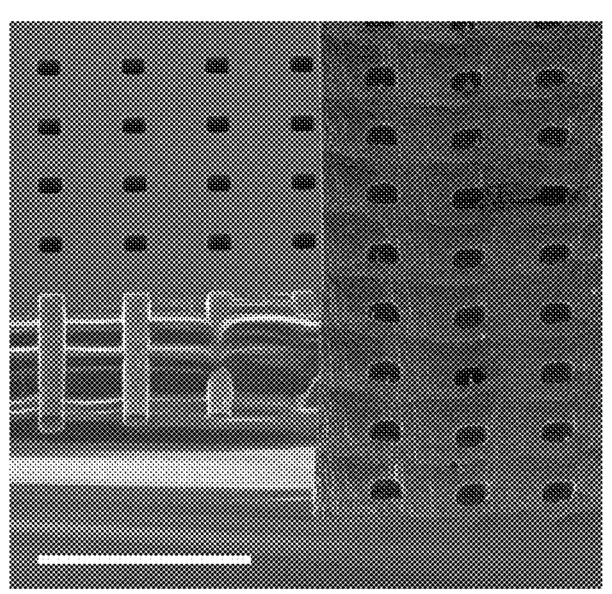
FIG. 7E
FIG. 7F
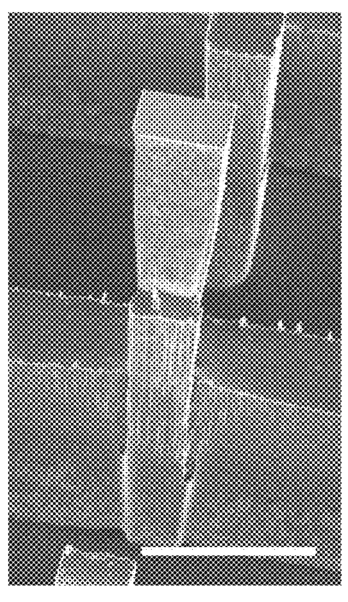
FIG. 7G

STRUCTURED MICROCHANNEL COOLING TECHNOLOGY BY UTILIZING A NOVEL HARD MASK PATTERN TRANSFER FABRICATION PROCESS

CROSS REFERENCE TO RELATED APPLICATIONS

This application claims the benefit of U.S. provisional patent application 63/341,706, filed on May 13, 2022, and hereby incorporated by reference in its entirety.

This application is a continuation in part of U.S. patent application Ser. No. 18/129,657, filed on Mar. 31, 2023, and hereby incorporated by reference in its entirety.

Application Ser. No. 18/129,657 claims the benefit of U.S. provisional patent application 63/326,109, filed on Mar. 31, 2022, and hereby incorporated by reference in its entirety.

GOVERNMENT SPONSORSHIP

This invention was made with Government support under contract 1449548 awarded by the National Science Foundation. The Government has certain rights in the invention.

FIELD OF THE INVENTION

This invention relates to improved microchannel structures.

BACKGROUND

Microchannels have been a very attractive candidate for almost all types of active cooling technologies since the days of Tuckerman and Pease who showed that, by forcing large quantities (up to 2 cc/s) of coolant fluid through miniscule microchannels (57 um wide, 375 um height), extreme values of heat flux (~790 W/cm$^2$ with a superheat of 71° C.) can be dissipated. This massive feat was achieved by following a simple fundamental rule of forced convection, which states that the heat transfer coefficient during internal forced convection is inversely dependent on the length-scale of structure through which the coolant is being forced through. Since then, advancements in lithography-based cleanroom processing techniques have enabled us to reduce this minimum channel width achievable to the orders of 1-2 um, and through for more advanced techniques like e-beam lithography to even sub-micron levels (order of 200 nm). Such channels indeed lead to better cooling performance following the same fundamental principle as before, although naïvely scaling down the channel dimension poses other prohibitively detrimental issues—very high pressure drop (input power requirement) associated with forcing large quantities of fluid through such miniscule channels, since pressure drop inversely scales with a positive power (x) of channel hydraulic diameter, D ($\Delta P \sim 1/D^x$).

In fact, the pressure drop increases at a much faster rate with the reduction of channel dimension, than the rate of increase in thermal performance, which puts a practical limit to the benefit we achieve by making extremely small channel. Since then, cooling devices have been characterized by two important parameters, thermal resistance, $R_{th}$ (low thermal resistance means high heat transfer coefficient and thus, superior thermal performance) and pressure drop, $\Delta P$—research since then have progressed with the objective to keep $\Delta P$ as low as possible while simultaneously bringing down $R_{th}$. One of the most attractive ways to achieve this is to create hybrid hierarchical structures that cleverly combine two different types of features together by laying nano-microscopic elements on top of much larger underlying microstructural backbone. In the case of u-channels, this comes in the form of structuring the base of these channels with other smaller features like micro-pillars. These micro-pillars enhance the total area available for heat transfer, provide additional sites for nucleation during flow boiling and in some cases is also responsible for suppressing two-phase flow instabilities that eventually lead to dry-out and catastrophic device failure. A recent work utilizes a complex microfabrication process involving wafer bonding to introduce pin fin microstructures at the bottom of a conventional microchannel to suppress boiling instabilities (one wafer contains the micro-pillars which acts as the structured u-channel base while the other wafer has large channels etched through them to act as the microchannel sidewalls. When bonded together they give rise to hierarchical channels. They reported heat transfer coefficient improvements for from 17% to over 117% for microstructured microchannel compared to smooth microchannel, for 25 and 75 μm tall micropillars, respectively, using methanol as the working fluid without significant increase in pressure drop. This complex two wafer fabrication process flow was employed because cleanroom-based processing, although ubiquitous and versatile, suffers from a major limitation—it is unable to create fully 3D multi-level, hybrid, hierarchical structures.

Conventional cleanroom techniques can create structures that we call 2.5D (the lithography design can be etched or extruded to the same height value everywhere on the wafer, different parts of the lithography design cannot have different depths into the wafer). To make fully 3D structures, conventional cleanroom process flows would normally require us to break the overall design into multiple sub-designs and employ multiple rounds of (lithography with sub-design+etching to desired depth) to achieve the fully 3D multi-level structures. The bottleneck arises due to unsatisfactory second round of lithography on wafers which have already gone through one round of (lithography+etching) and thus has etched features (~10 um or more) in them.

In conventional lithography-based cleanroom process flows, creation of etched features usually follows these step:

a) Coating Photoresist (PR) on the wafer—When PR is puddle dispensed at the center of a Silicon wafer spinning at a high RPM, it spreads radially outward to create a thin (1 um to 10 um depending on PR viscosity and spin RPM), uniform and conformal coating over the wafer. Thicker PR (7 to 10 um) is not desirable as it increases the minimum resolution that can be achieved after exposure of a design in step b. The uniformity of the PR layer is also highly crucial for success of the downstream processes.

b) Exposure of design to pattern the PR and development of exposed features—Next, UV light of appropriate wavelength, energy and distance is used to expose the design layer on the PR (this selectively changes the chemical composition of the PR and makes it soluble in the developer solvent) and a developer is used (in most cases, MF26A—2% TMAH soln.) to wash away the exposed areas (if the PR is positive). Non-uniform coating of PR leads to unsatisfactory exposure, causing overexposure in certain parts of the wafer and underexposure in others. Thus, in a way, the success of the overall process rests entirely upon step (a) and our ability to achieve a thin, conformal coat of PR on the wafer.

c) Deep Silicon Etch—Finally, the wafer is etched in a deep Silicon etcher that uses time-multiplexed Bosch process to anisotropically etch features in the Silicon selectively where the exposure had happened in the previous step (the PR which is left behind acts as a masking layer and prevents etching in these zones). After this process, the features created across the wafer have the same height/depth.

To achieve multi-depth structures using this technique, where different parts of the wafer need to have different etch depths, the sequence of steps (a, b and c) needs to be repeated multiple times with a different exposure design in step b, and different etch time in step c.

The primary challenge arises in step (a) itself when PR is attempted to be spun on the wafer with deep features already etched in them. The spinning process is satisfactory (thin and uniform) when the PR thickness (ideally, less than 4 um for low exposure resolution of 2 um in step b) is much larger compared to the etch height of the features. Thus, in cases (some cases of IC fabrication) where the already etched feature height is <=1 um, this process works perfectly, but in most useful applications of microfluidics, liquid cooling, optics and semiconductor fabrication, these etch depths can range anywhere from 1 um to 500-600 um, and leads to unsatisfactory coating in step a. Several problems like streaking (PR layer being wrinkled after hitting an etched feature), fingering (PR getting trapped in a deep cavity/channel and progressing along those channels only), and incomplete coverage (PR hitting the corner of an etched feature and failing to cover the rest of the wafer) mar the spin coating process in step a—thereby leading to failure of the whole process.

Accordingly, it would be an advance in the art to provide monolithically fabricated multilevel microchannel structures.

SUMMARY

Here we consider application of an unconventional process flow using commonly used cleanroom tools which mitigates all these problems and enables us to create multi-level structures with ease. In one example, we have replaced the etch mask layer from PR with Silicon Oxide (SiO). The idea is to perform multiple rounds of lithography to pattern this new SiO mask layer instead of patterning the Silicon directly, after which, through deep Si etching this pattern gets scaled and transferred to the Silicon. In one example of this new process flow the steps are as follows:

i) Deposit Silicon Oxide on the wafer—CVD (Chemical Vapor Deposition) or HDPECVD (High Density Plasma Enhanced CVD) process is used to deposit a 1-2 um layer of Silicon Oxide (SiO) on a bare Silicon wafer (Thermal oxide also works fine). This acts as a hard mask during the Deep Silicon Etching.
ii) Coating PR (same as step a),
iii) Exposure and Development (same as step b),
iv) Etch SiO—Silicon Oxide is etched precisely to achieve the desired step height. It should be noted that the maximum step height in SiO thus, cannot exceed the total initial SiO thickness (1-2 um).

Multiple rounds of step (ii, iii and iv) (lithography+SiO etch) are performed on the wafer to create a hierarchical multi-level structure in the SiO layer itself. In this situation, the most crucial step (step a or step ii) of spinning the PR on the SiO coated wafer works perfectly. The obtained PR layer is thin and uniform since the PR thickness (4 um) is >4× larger than the etched step height in SiO (~1 um).

The final step is performing a Deep Silicon etch using the 3D hierarchical SiO layer as the hard-mask. After the etching has been completed and all the SiO has been consumed, the 3D structure that was created in the SiO (by multiple rounds of lithography) is scaled by the etch selectivity (ratio of etch rate of Si to etch rate of the mask layer, SiO) and transferred to the Si. Additionally, SiO is much superior to hardened PR as an etch stop mask layer providing Si:SiO selectivity of 200-300 during deep Si etch using the Bosch process (for comparison, same etching recipe provides Si:PR selectivity of 80-150), which enables us to create structures as tall as 400-500 um.

Preliminary tests have demonstrated the ability to create 3D hierarchical features of nominal dimensions (width)~5-10 um with aspect ratios (height/width) as large as 10-15. The resolution can be further improved by using e-beam lithography instead of conventional lithography.

This process flow of creating multi-level structures has been tested more than 5 times with different orders of step heights (250 nm through 900 nm) to establish reliability and repeatability of the process. Moreover, this process employs only a single step of deep Si etch, thus making it much less expensive and time consuming as compared to the conventional lithography route which employs multiple rounds of deep Si etch (number of levels required in the structure=number of deep Si etch steps). This will increase throughput while simultaneously reducing cost per device when used in an industrial mass production scenario. This approach could open a much wider window of opportunity for design, optimization and fabrication of 3D silicon-based micro/nanostructures that have not been previously seen or explored.

It is to be noted than even though specific tools have been used to make our structures, these processes (lithography, SiO deposition through CVD, SiO etch, Deep Reactive Ion Silicon Etch) are very commonly employed tools and processes in any cleanroom. Thus, no tight process tolerance has been imposed. For each application or design, a simple characterization mask (with different feature widths) is to be used to determine (in a single characterization run) the dimension dependent PR—SiO etch rate, SiO—Si etch rate which will vary across different cleanrooms—although these two numbers are the only parameters needed to fully characterize the process. These can also be used in the digital mask designing phases for the final structure.

Additionally, this concept technology can be extended to other mask material. For example, several studies have reported extremely high etch selectivity using metal masking layers (around 10^5 with Aluminum). Other metals (like Pt, Au, Cr) and metal oxides (alumina) could be used as a masking material as well to get even higher aspect ratio (>35) structures. Some of these masking layers can be deposited through other methods like ALD or evaporation or sputtering or electroplating. The change of mask or substrate material will only result in the difference in selectivities and etch rates, which will be similarly determined using a single, initial characterization run and characterization mask—the data obtained from this characterization run can be then used to design masks and process flow to obtain final target multi-level structures.

This new methodology offers an economical way to reliably achieve multi-level features ranging from 10 to 400 um depth without deviating from conventional microfabrication processes. This technique also circumvents the multiple deep Silicon etching steps (which is often the most expensive step in the process flow) and achieves the multi-level features through a single-shot deep Si etch via pattern transfer from a Silicon Oxide hard-mask to Si. This approach could open a much wider window of opportunity for design, optimization and fabrication of 3D silicon-based micro/nanostructures that have not been previously seen or explored.

Further details on this method are provided in U.S. patent application Ser. No. 18/084,303, filed Dec. 19, 2022 and hereby incorporated by reference in its entirety.

In the context of passive wicking-based heat spreaders (heat pipes, vapor chambers), this fabrication approach enables us to create new structures, such as multi-level pillar array type structures (more than 1 height/depth of pillars) with a capability to make microstructures with total height >150 um with resolution (defined as minimum achievable step height between two levels or heights) as low as 2-3 um.

Such multi-level pin fin array type structures have never been fabricated by anyone previously. General multi-level structures have been created before but they have been limited to have moderate aspect ratios and be less than 100 um height. Our work specifically deals with total height >150 um and feature lateral width as small as allowed by lithography (>=1 um).

Such multi-level structures provide significant advantages.

Good Heat Spreaders have— i) High capillary performance of evaporator wick (more amount of liquid should wick fast from condenser back to evaporator)—Tall features wick liquid more quickly.

ii) Low Wick thermal resistance (wicks should be thin so that liquid trapped in between has smaller thermal resistance)—Short features mean low thermal resistance.

If a single-level evaporator has only tall pins then thermal performance is poor (less amount of heat dissipated, low CHF). If they have only short pins then capillary performance is poor (fluid does not reach device center, severe limit on device size, thus technology not scalable)

We are able to make multi-level pin arrays, that will include both tall and short pins to solve the problem—tall pins, or arteries or channels will be placed to provide fluid path from reservoir to device center, short pins will be directly placed on hot-spots, they will retain fluid longer, delay dry-out (device failure) and provide improved thermal performance (specifically, low thermal resistance). Additionally there can be a few extra tall pillars—for mechanical support, sustain high pressure in large devices, provide shorter path for liquid return from condenser to evaporator.

Our demonstration of creating these hierarchical structures without deviating from standardized cleanroom techniques and processes, opens a world of possibilities in terms of the types and topology of structures that can be created in wafers (could also be extended to wafers of other materials like GaAs).

This technology is expected to have significant impact on industries that rely primarily on micro-nano structures for the efficacy of their devices. Micro-nano structures and wicks are widely used in microfluidics, liquid cooling, water purification and harvesting, sorption, desorption processes, sensors, and varieties of MEMS and NEMS technologies. Fabrication difficulties have been the primary inhibitor to both research and adoption of such hybrid, hierarchical wicks in existing technology. This novel process flow for easy creation of hybrid wick will, hopefully, encourage more detailed investigation and adoption of these structures in standard technologies and eventually drive up their respective performance metrics by several orders of magnitude.

In the context of microchannel structures, this fabrication approach also enables us to create new structures, such as multi-level microchannel structures (more than 1 height/depth of channel features) with a capability to make microstructures with total height >150 um with resolution (defined as minimum achievable step height between two levels or heights) as low as 2-3 um.

Our demonstration of creating these hierarchical structures without deviating from standardized cleanroom techniques and processes will enable creation of novel 3D structures for applications in microfluidics, cooling technologies, optics and other MEMS devices. As stated before, since this new technique involves lesser number of steps and less time/cost per step (etching SiO is significantly cheaper and faster compared to deep Si etch), it will increase device throughput while simultaneously bringing down cost per device.

This technology will have significant impact on industries that rely primarily on micro-nano structures for the efficacy of their devices.

Additionally, the impact of this work is felt strongly because it will be able to replace chip stacking (which is the commercial go-to technology to make multi-level structures) technology, and other techniques like grayscale lithography. The proposed method is more robust, well controlled, more reliable and has enabled us to push process yield to >90%. It solves the two main problem that prevents the adoption of grayscale lithography by any lab by enabling the creation of tall, high aspect ratio structures and the solving issues regarding profile distortions of the PR profile. This method involves a very simple characterization step, and will thus help standardize the process. In addition, the use of simple processes (CVD, etch, lithography) and tools will be very attractive especially when one considers the integration of this tech to existing processing lines.

Several novel multi-level configurations are possible for microchannel systems that will enable massive improvements in thermal performance.

1) Stepped Channels with Surface Roughness in Each Step—

The cross section of the microchannels used in cooling devices does not necessarily need to be rectangular (which is usually the case with conventional cleanroom manufacturing techniques). They could be tapered inward with multiple steps—this can help us tailor flow velocity within the channel, improve near wall flow velocity and increase thermal performance. The number of steps can be defined by the number of lithography rounds performed. FIGS. 6A-D shows some exemplary tapered channels.

2) Structuring or Introduction of Surface Roughness on Multi-Level Channels—

As mentioned before there are immense advantages to using micro nanoscopic elements to enhance thermal performance in single or two-phase microchannel convective cooling scenarios. These elements enhance the surface area for solid-liquid contact area and provide extra nucleation sites during boiling. Through this novel pattern transfer method, such surface roughness elements can be combined and laid very simply on top of a multi-level structures, by using one extra round of lithography. Multiple rounds of lithography can also be used to make the roughness elements multi-level or have varying heights. These pins can also have innovative shapes and topologies that might come in useful in targeted applications. FIGS. 7A-10B show some of the possibilities that could be useful.

3) Channel Profile Design to Follow Flow Streamlines—

3D flow coolers are becoming increasingly popular nowadays where a manifold layer is used along with the Cold Plate channels to route the fluid in 3D in the cold plate. In such situations fluid follows a u-bend shaped flow streamline as it enters and leaves the Cold Plate channels. In straight microchannel situation, there are sections of Cold Plate channel where the flow stagnates—these zones are characterized by low fluid velocity and hot recirculating fluid, thus locally deteriorating the convective cooling performance. To mitigate this effect, we can design smooth U-shaped contour in the Cold Plate that follows the streamline. This will eliminate the stagnated recirculating fluid, and enhance solid liquid contact surface area in the Cold Plate, thus improving thermal performance. FIGS. 11A-B show an example of this concept.

BRIEF DESCRIPTION OF THE DRAWINGS

FIGS. 6A-D show some exemplary tapered microchannel structures.

FIGS. 7E-G show several images of lithographically defined multi-level surface roughness in microchannel structures.

DETAILED DESCRIPTION

A) General Principles

Figure 1:
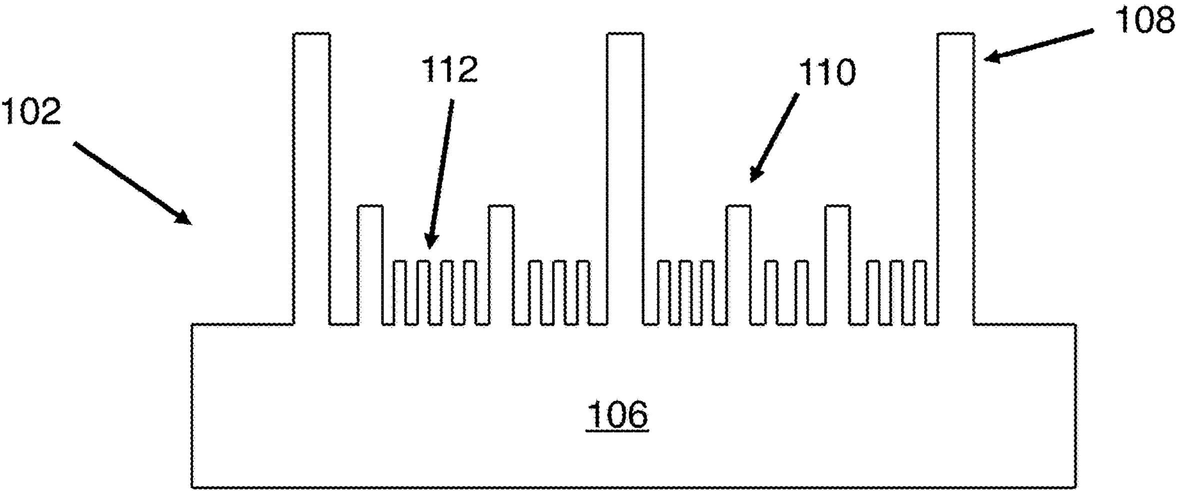
FIG. 1 shows an exemplary embodiment of the invention.

In this work we provide multi-level post (pillar) type structures (note that multi-level pin fin type structures have not been reported in any previous study) with the following characteristics—

1. Will have two or more levels of pillars (conventional methods can also make more than one level structures)
2. The maximum height difference in the multi-level structure is more than 150 um (conventional grayscale lithography technique has only demonstrated 3D structures with a maximum height difference of 100 um). We can easily push this to more than 150 um and this is a major advantage of our approach. This is especially useful in many applications since structures associated with microfluidics and microfluidic cooling technologies (here we can mention passive heat spreaders, like vapor chamber of heat pipe) operate in the micro-meso scale.
3. The resolution of steps achievable is also pretty high in our method, 2-3 um as compared to conventional chip stacking (chip stacking has a resolution of 30-50 um for the in-between middle layers)

We provide improvement (higher thermal performance and being able to scale up the technology) in passive cooling devices by having multi-level microstructures of different heights. The performance of most conventional passive cooling devices (vapor chambers, heat pipes) is almost solely determined by the microstructure pore size on the evaporator wick. A smaller microstructure pore size helps in fluid retention over the hot-spots, reduces conduction resistance of the thin film of fluid and enhances heat transfer area during device operation. Although, the full potential of these small pored structures are not utilized as smaller pore sizes are also accompanied by other problems. Smaller pore sizes simultaneously reduce the total amount of fluid that can be successfully wicked back from the condenser to the evaporator thus putting a transport-based limit (called, capillary limit). These issues lead to two more issues that are the primary hurdles to widespread use and commercialization—low critical heat flux (CHF) that can be dissipated from the hotspot and device cannot be scaled up to dissipate heat from larger areas. To mitigate these problems, truly 3D structures can be made monolithically out of a single wafer (e.g., a silicon wafer) as described herein.

These devices could have a combination of features—taller pin-fins, channels, arteries wherever fluid transport is desired and have smaller pored structures over and near the hot-spots to maintain low resistance and good thermal performance. The standardization of the new method (which can be done with great ease) into processing flows in industry and academia will significantly expand the design space available to us in terms of structure types and topologies we can make monolithically. Additionally, the vapor chamber can also have some much taller pin fins interspersed in the heater zone. These are structural pins acting as bonding sites with the other layer, to provide mechanical support to the overall device and sustain a higher pressure before bursting. Moreover, these pins also provide shorter pathways for liquid return from the condenser to the evaporator, thus increasing capillary transport limited CHF.

FIG. 1 shows an exemplary embodiment of the invention that is a passive wicking-based microfluidic heat spreader 102 including:

a monolithically microfabricated array of wicking features (e.g., pins 108, 110, 112), where the monolithically microfabricated array of wicking features includes a substrate 106 and features having two or more different vertical feature heights above the substrate (e.g., features 108, 110, 112 have three different heights above substrate 106). The monolithically microfabricated array of wicking features does not include any wafer-to-wafer bonds, and it includes features having a vertical feature height of 150 microns or more. As indicated above, such deeply etched wicking structures are not possible to make with conventional fabrication methods, and thus, to the best of our knowledge, have not been previously reported.

Here a monolithically microfabricated array of wicking features is an array of wicking features fabricated by processing a single wafer (as opposed to processing two or more wafers and then bonding them together). As a result, a monolithically microfabricated array of wicking features has the structural feature of not including any wafer-to-wafer bonds.

The wicking features can include one or more pins that rise vertically from the substrate surface. Vertical heights of the one or more pins can be configured to provide a vertical height gradient (FIG. 5) in the monolithically microfabricated array of wicking features. One or more of the pins can be a multilevel pin (FIG. 3) having two or more pin features with different vertical heights above the substrate surface.

One or more fluid passages (e.g., 212 on FIG. 2A) can be present in the substrate. At least one of the fluid passages can be configured as a hole passing vertically though the substrate (e.g., 212 on FIG. 2A).

One or more vertical vias (e.g., 214 on FIG. 2A) can pass through the substrate. A height/width aspect ratio of at least one of the vertical vias can be 10 or more.

Figures 2A, 2B:
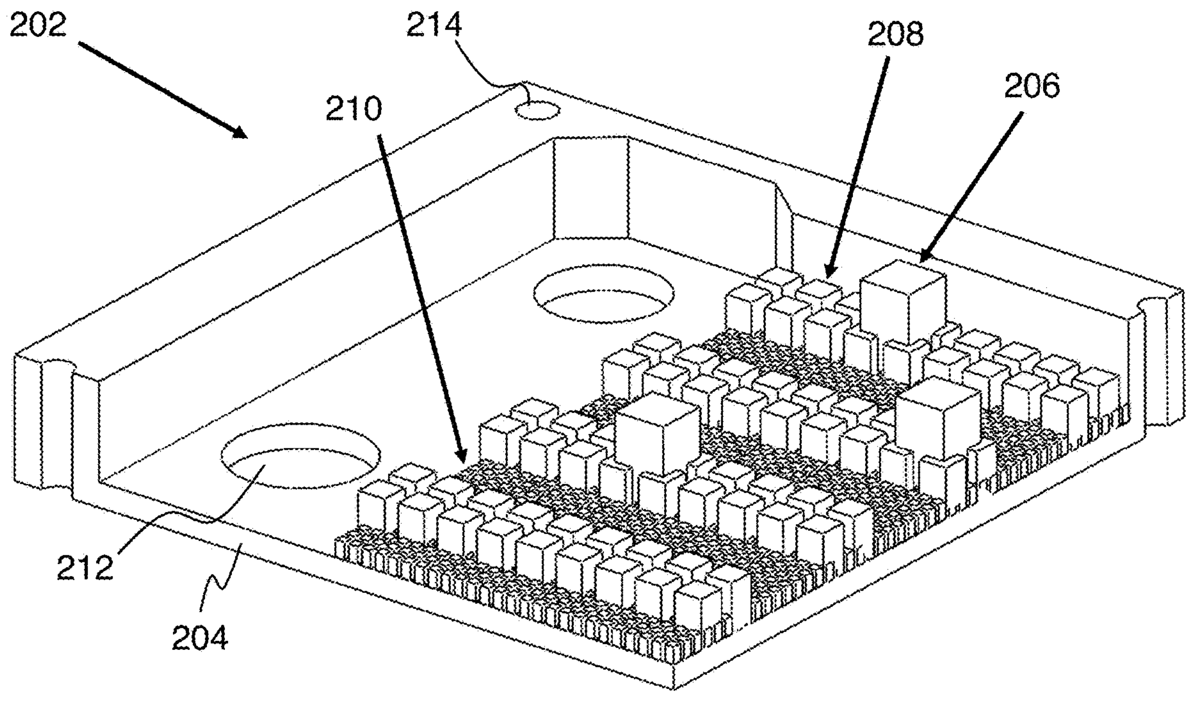
FIGS. 2A-B show two views of an exemplary monolithically microfabricated array of wicking features.
Figure 2C:
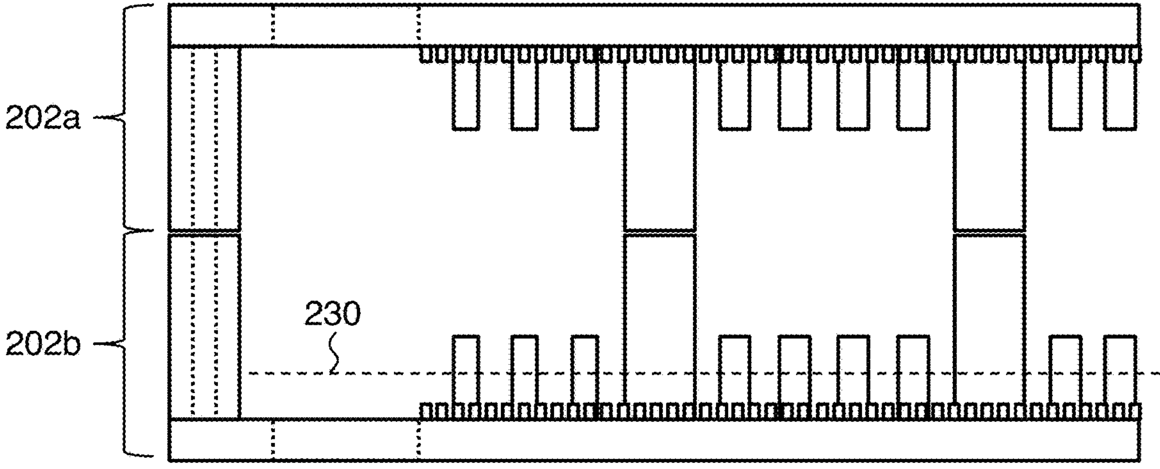
FIGS. 2C-D shows examples of the use of the monolithically microfabricated array of wicking features of FIGS. 2A-B in a vapor chamber.

A vapor chamber can include a first passive wicking-based microfluidic heat spreader as above (e.g., 202*a* on FIG. 2C, and a second passive wicking-based microfluidic heat spreader as above (e.g., 202*b* on FIG. 2C), where the first and second passive wicking-based microfluidic heat spreaders are disposed to form an enclosure. In this example, an evaporative coolant (e.g., 230 on FIG. 2C is disposed in the enclosure.

A vapor chamber can include a passive wicking-based microfluidic heat spreader as above (e.g., 202 on FIG. 2D), a capping layer (e.g., 220 on FIG. 2D) disposed to form an enclosure with the passive wicking-based microfluidic heat spreader, and an evaporative coolant (e.g., 230 on FIG. 2D) disposed in the enclosure.

B) Examples—Heat Spreaders

FIGS. 2A-B show another exemplary embodiment. Here passive wicking-based microfluidic heat spreader 202 includes substrate 204, tall pins 206, intermediate pins 208 and short pins 210. It also includes fluid inlet/outlet ports (e.g., port 212) through the substrate and vertical via(s) (e.g., 214). As indicated above, pins of different height have different functions. Short pins 210 are disposed near hot-spots for better thermal performance, intermediate pins 208 provide better fluid transport from device edge to center, and tall pins 206 can act as mechanical support pillars.

Vertical vias are often desirable for establishing multi-layer multifunctional chips. Our approach enables easy creation of high aspect ratio vertical vias, that are expected to enable next generation 3D electronic vertically expanded chiplets. Vertical vias and other through holes (for fluid charging or flow) can be simultaneously fabricated with ease during wick formation because of the one shot etching employed by this process.

The fluid ports are typically much larger in lateral dimension than the vias to accommodate flow, so their aspect ratio is lower than that of the vias. These are easy to make, a variety of other methods can be used—laser cutting, water jet cutting, micromachining, drilling. Our method enables simultaneous creation of all these different features (active wick microstructures, other steps in silicon for integration, roughness, holes, vertical vias, through ports) monolithically out of a single substrate.

Figure 2D:
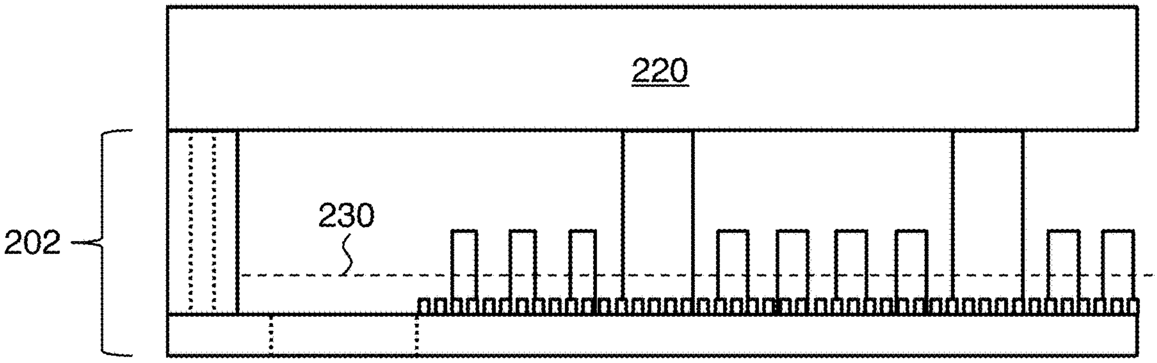

As indicated above, a vapor chamber can be formed by making an enclosure that includes wick structures as described herein. FIG. 2C shows a first example, where wick structures 202*a* and 202*b* form an enclosure in which evaporative coolant 230 is disposed. Here wick structure 202*b* can be the condenser and wick structure 202*a* can be the evaporator (as shown), or vice versa. FIG. 2D shows a second example, where wick structure 202 and capping layer 220 form an enclosure in which evaporative coolant 230 is disposed. Here it is preferred that wick structure 202 be the evaporator, as shown.

Figure 3:
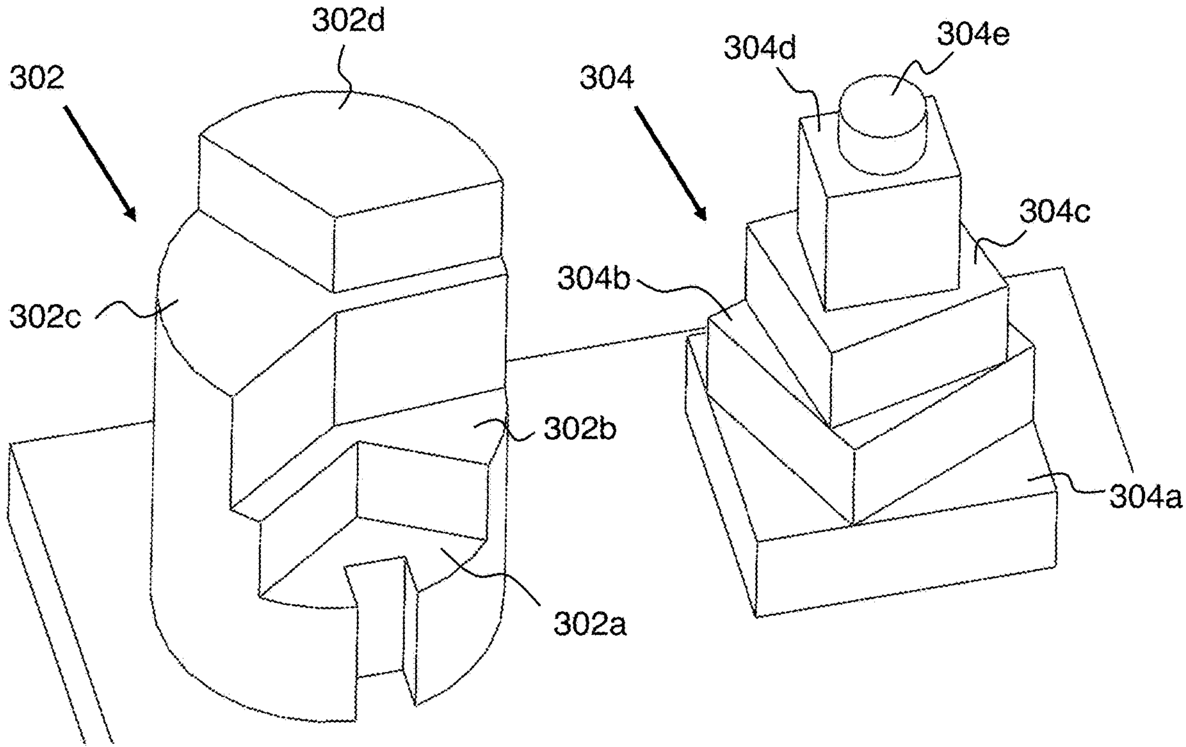
FIG. 3 shows examples of multi-level pins.

Single features, e.g., a single pin, can individually be multi-level. FIG. 3 shows some examples. Here pin 302 includes features 302*a*, 302*b*, 302*c*, 302*d* at different heights. Similarly, pin 304 includes features 304*a*, 304*b*, 304*c*, 304*d*, 304*e* at different heights. In a passive heat spreader, these individual pin features can be used for increasing surface area for heat transfer, increasing capillarity of the wick, modulating porosity with wick height for easier vapor venting etc. This capability is enabled by the lack of a limitation on the number of lithography rounds that can be reliably performed on the oxide, so different pins can be designed to also have multiple levels.

Figure 4:
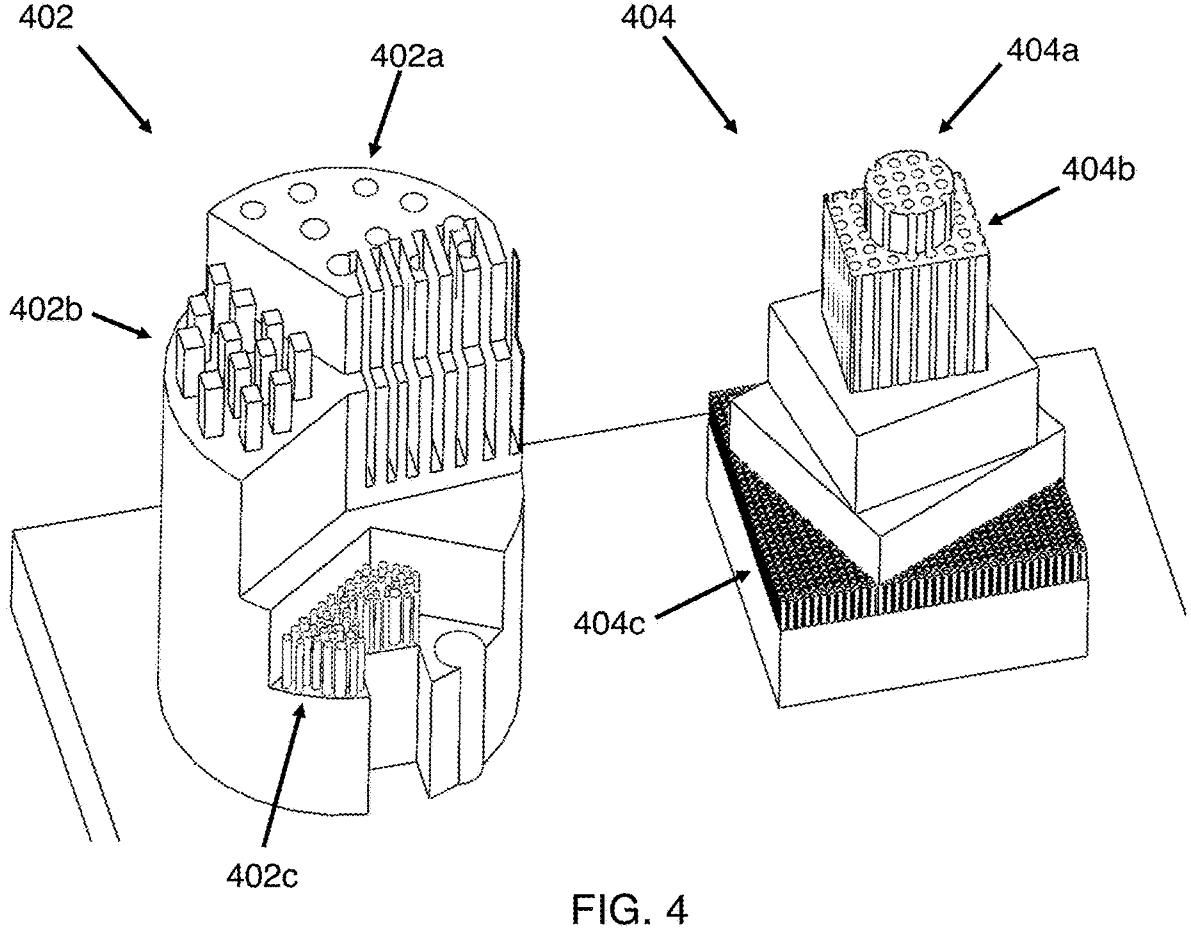
FIG. 4 shows examples of pins having holes and/or roughness.

Another capability provided by this technology is well-controlled porosity and/or roughness of individual pin features, as in the examples of FIG. 4. Here pin 402 has holes 402*a* and controlled roughness 402*b*, 402*c*. Similarly, pin 404 has holes 404*a*, 404*b* and controlled microroughness 404*c*. This approach is a reliable way to introduce well controlled multi-height pillared roughness to the base of any microstructure instead of relying on other methods (UV laser rastering, hydrothermal synthesis of nanotube, nanowire etc.) which are stochastic and thus provide less control over the roughness elements and parameters (porosity, element width and height, pitch, density). Base structuring is usually beneficial since it enhances mass transport and typically improves heat transfer performance as well.

Figure 5:
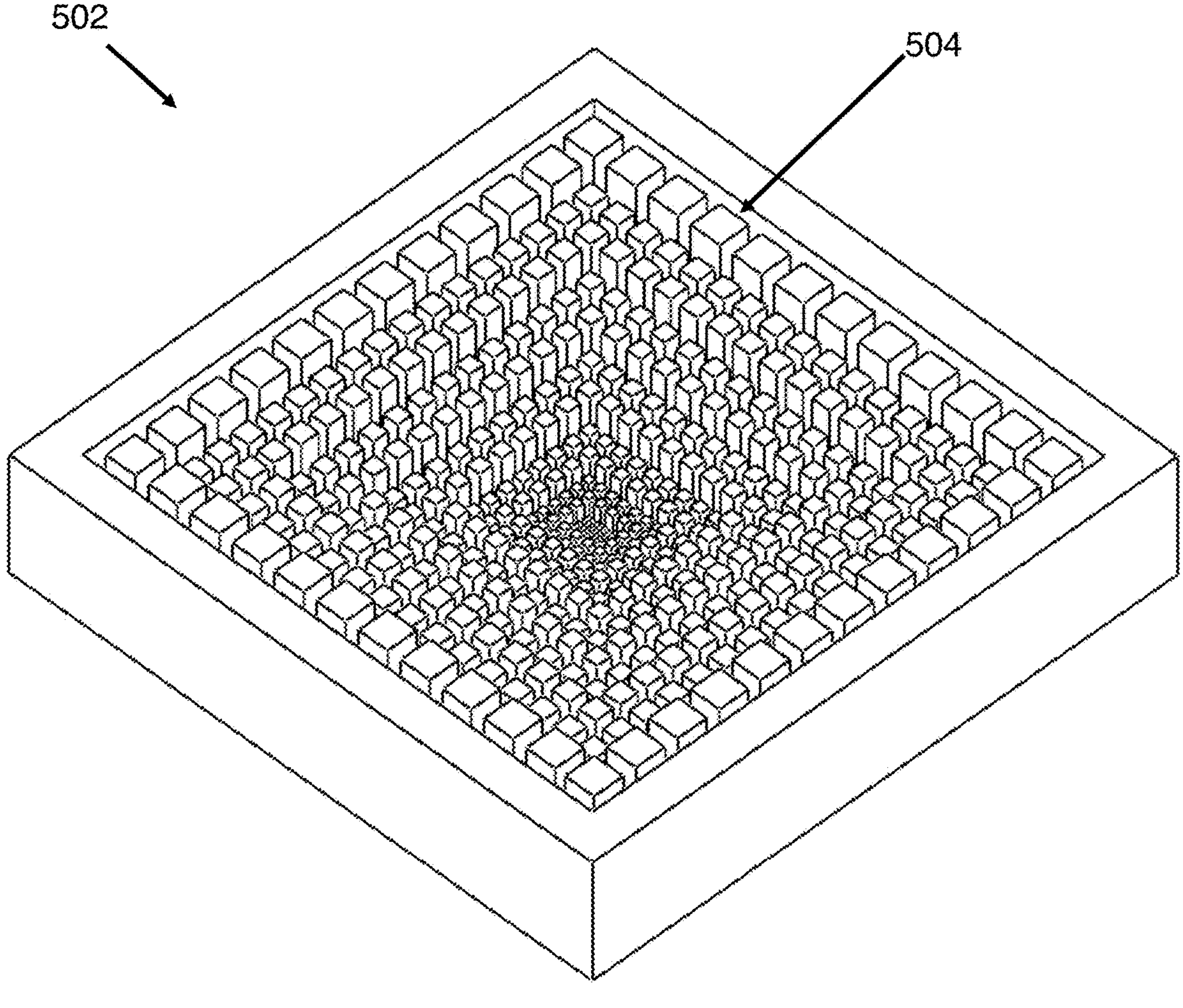
FIG. 5 shows an exemplary pin array having a gradient of pin height.

FIG. 5 shows an example of a gradient of pin height across the whole array. Here 502 is a monolithic multi-layer wick structure, and the pin array 504 has a height gradient from center to edge. This example is a wick with micro-pillar heights decreasing monotonically as we move towards the center of the device. Such devices, which have wick permeability monotonically increasing as we move to the device periphery can be an attractive solution to the problems associated with the massive liquid-to-vapor volume expansion. During device operation, the expanding vapor often gets trapped in monoporous wicks—unable to escape, they increase vapor pressure within the vapor chamber, which suppresses further phase change (thus reducing thermal performance). The monoporous wick also restricts lateral vapor spreading, which slows vapor transport to the condenser and worsens transport related issues arising in the device. Having taller pins as we move to the device periphery will help reroute the expanding vapor efficiently and quickly away from the hot-spots, thus preventing issues of vapor clogging and accumulation near the hot-spots, thus helping maintain the same high levels of performance at all vapor qualities. A 2.5D version of this gradient idea (where the peripheral pins have a higher pitch instead of taller height, thereby making a pitch gradient) has already been fabricated and demonstrated to work better than a corresponding monoporous counterpart in the literature. The device of FIG. 5 is expected to further improve the performance.

C) Examples—Microchannel Structures

As indicated above, the same processing method used for deep multi-level heat spreading structures can also be used to make deep multi-level microchannel structures. The resulting microchannel structures are generally characterized by being deep (i.e., including features with a height of 150 um or more) and being multi-level (i.e., features of the structure have two or more different vertical heights above the substrate). As indicated above, specific structures of this general kind that are of interest for microchannel applications include grooves with step-tapered side walls, lithographically defined surface roughness (various kinds), and arbitrary control of channel shape (e.g., to better match expected fluid flow patterns). Examples of each of these possibilities are described below in connection with FIGS. 6A-11B.

The examples of FIGS. 6A-D relate to channels having step-tapered side walls. FIG. 6A is a side view of channels 602 having 2-step side walls, and FIG. 6B is a side view of channels 604 having 4-step side walls. FIG. 6C is an isometric view of channels 604 of FIG. 6B. FIG. 6D shows a channel 606 having a larger number of steps in its side walls. In principle, any number of steps can be used to make tapered side wall channels. The cross section of the microchannels used in cooling devices does not necessarily need to be rectangular (which is usually the case with conventional cleanroom manufacturing techniques). They could be tapered inward with multiple steps—this can help us tailor flow velocity within the channel, improve near wall flow velocity and increase thermal performance. The number of steps can be defined by the number of lithography rounds performed.

As mentioned before there are significant advantages to using micro/nanoscopic elements to enhance thermal performance in single or two-phase microchannel convective cooling scenarios. These elements enhance the surface area for solid-liquid contact area and provide extra nucleation sites during boiling. Through this novel pattern transfer method, such surface roughness elements can be combined and laid very simply on top of a multi-level structures, e.g., by using one extra round of lithography. Multiple rounds of lithography can also be used to make the roughness elements multi-level or have varying heights. These pins can also have innovative shapes and topologies that might come in useful in targeted applications. FIGS. 7A-10B show some of the possibilities that could be useful.

Figures 7A, 7B:
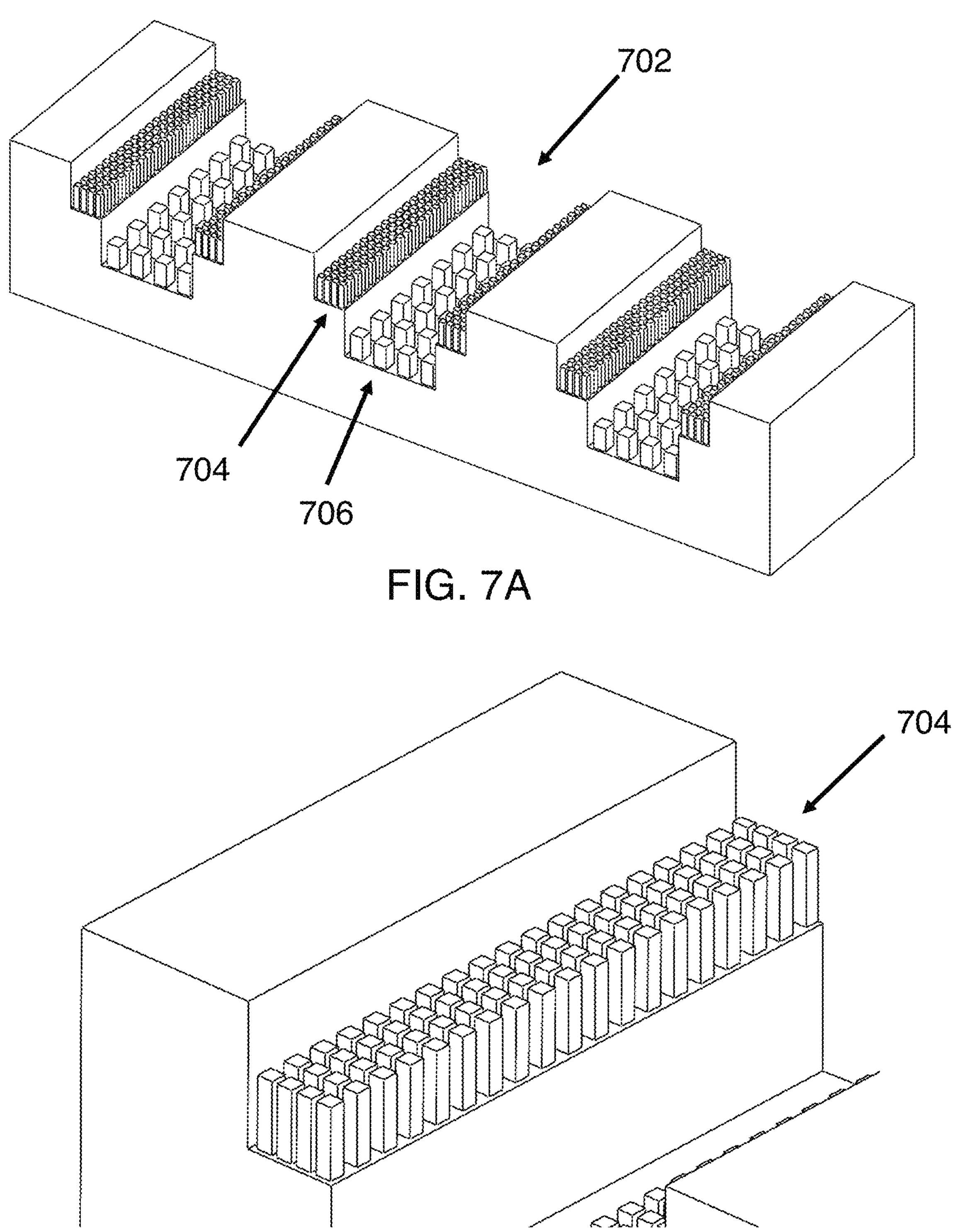
FIGS. 7A-D show several examples of lithographically defined multi-level surface roughness in microchannel structures.
Figure 7C:
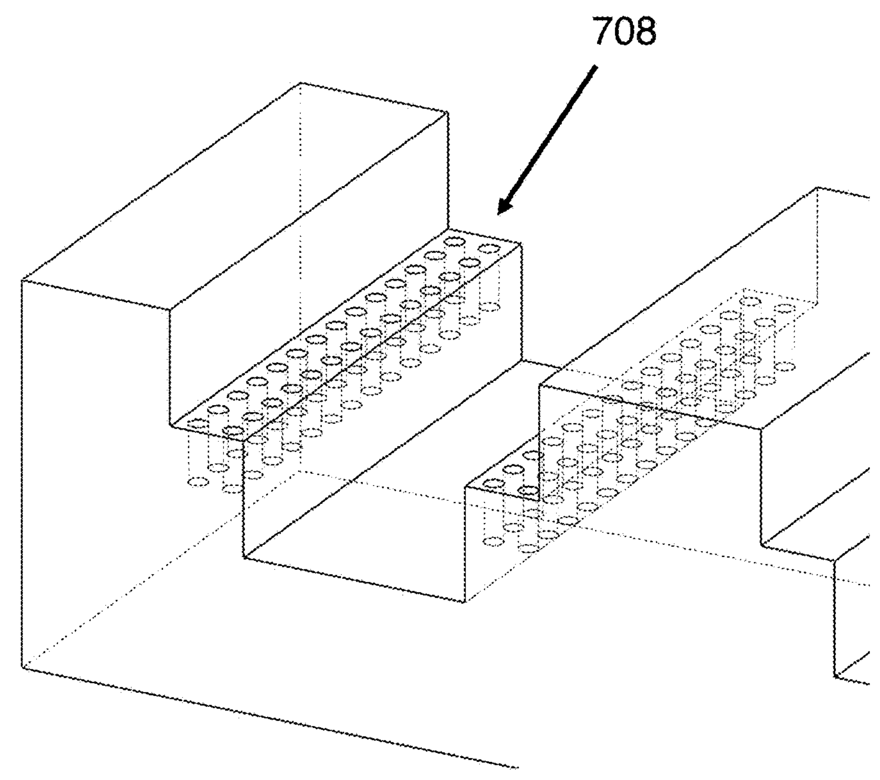
Figure 7D:
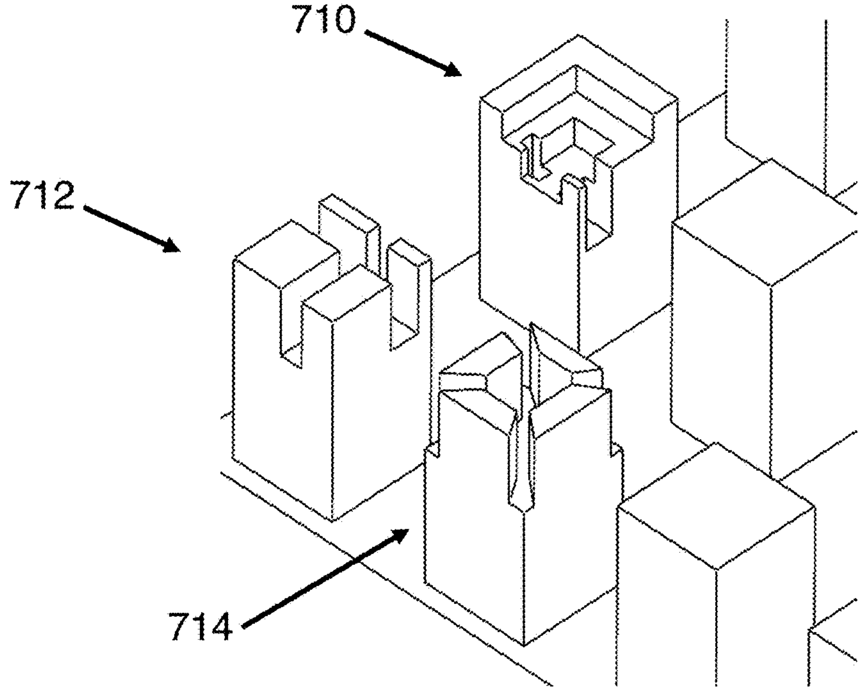

The example of FIG. 7A shows a channel 702 having lithographically defined surface roughness at multiple levels—roughness 706 at the bottom of the channels, and roughness 704 on side wall steps of the channels. FIG. 7B is an enlarged view of side wall surface roughness 704. In the example of FIG. 7C, the lithographically defined surface roughness 708 is a pattern of holes, instead of a pattern of pillars as in the earlier examples (704 and 706). The example of FIG. 7D shows that individual pillar or hole structures can also be multi-level. Here pillars 710, 712, 714 are individually multi-level, and at least pillar 710 can also be thought of as a pillar having a multi-level hole. Similar interpretations are also possible for features 712 and 714, and practice of the invention does not depend critically on whether features are defined as 'pillars' or as 'holes'.

FIG. 7E is an image of a fabricated structure having pillars as on FIG. 7B. FIG. 7F is an image of a fabricated structure having holes as on FIG. 7C. FIG. 7G is an image of a fabricated structure having multi-level pillars as on FIG. 7D.

Figure 8A:
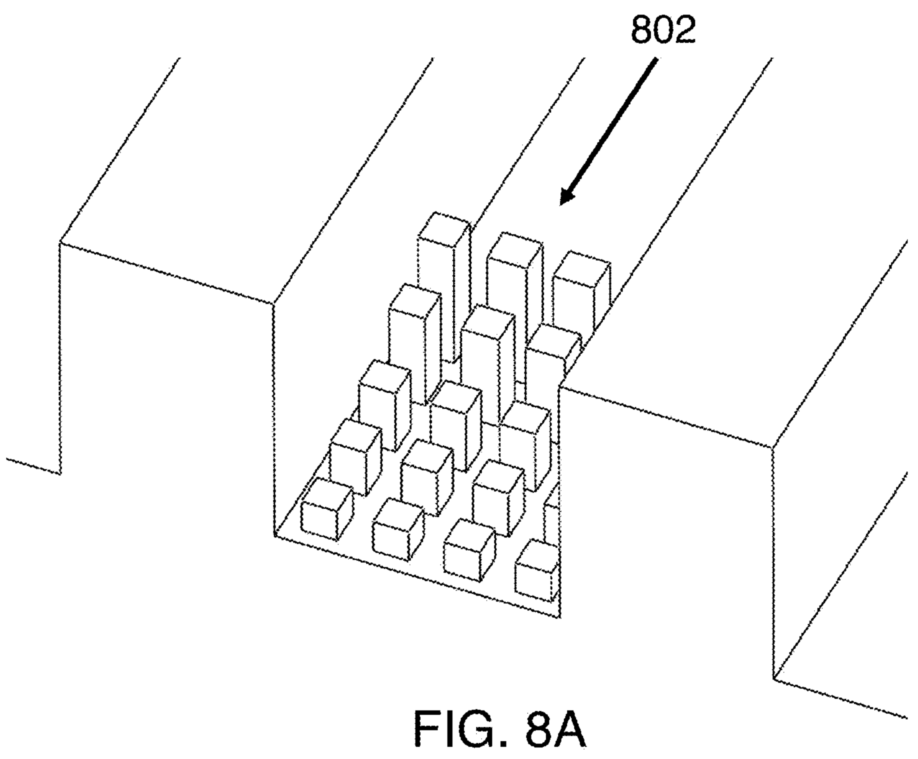
FIGS. 8A-D show an example of a height (or depth) gradient of lithographically defined multi-level surface roughness in microchannel structures.
Figure 8B:
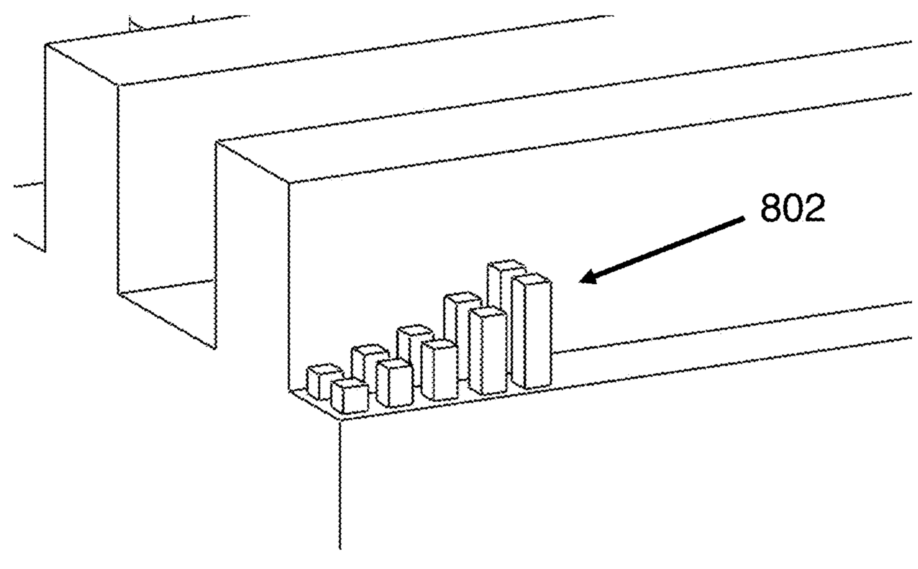
Figure 8C:
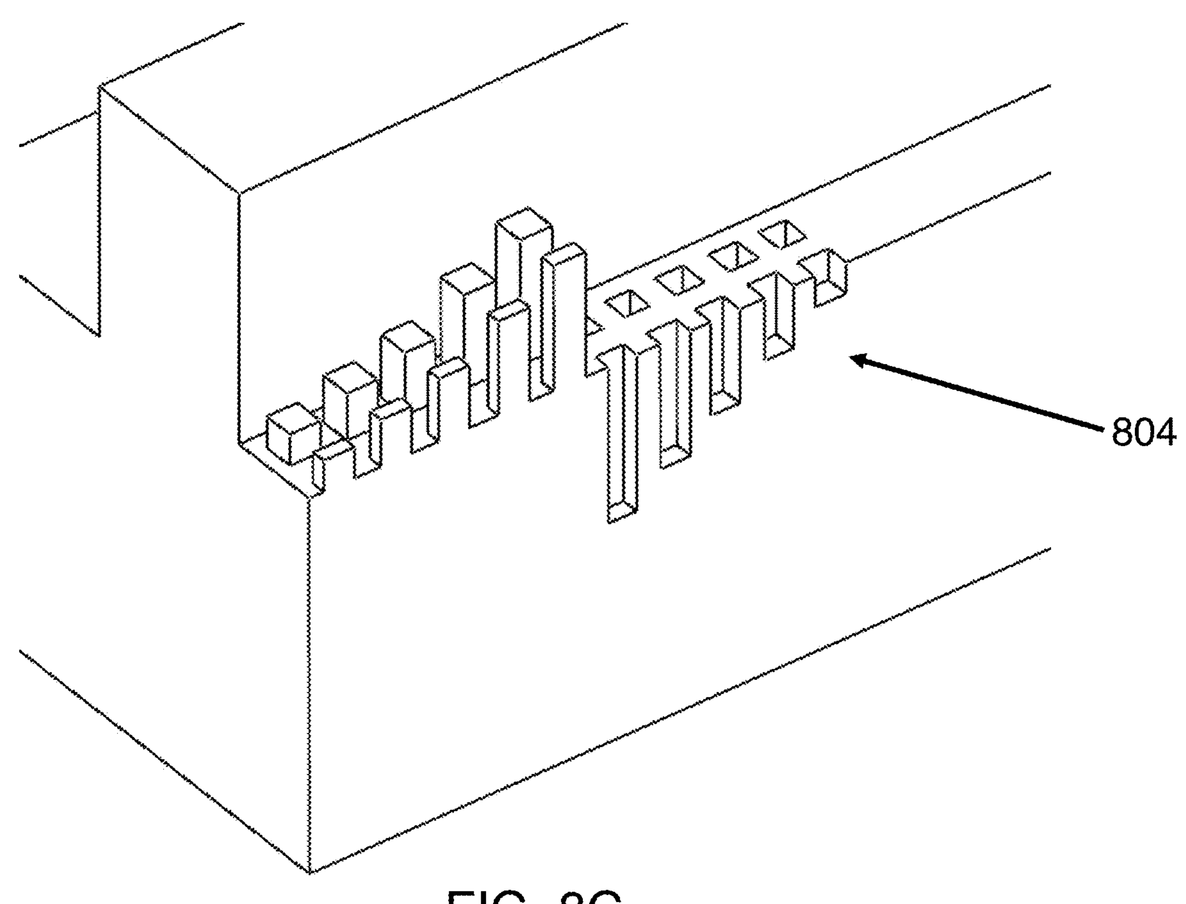
Figure 8D:
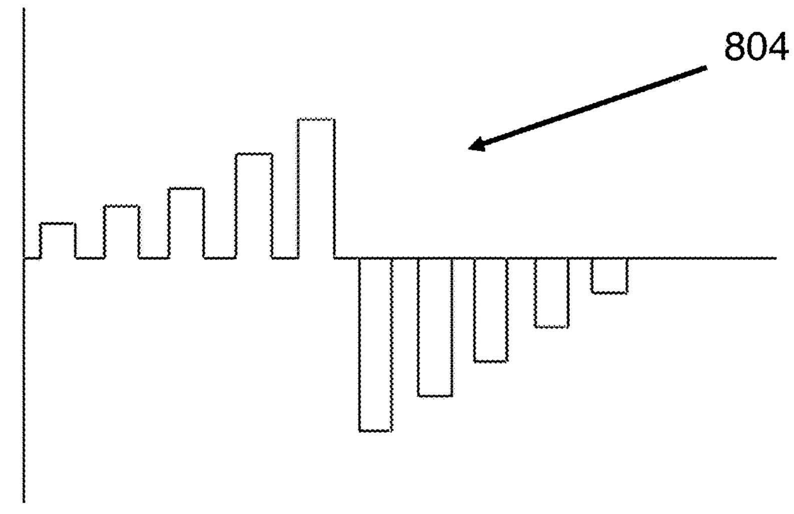

The example of FIGS. 8A-B show a channel having surface roughness features 802 on the bottom of the channel where the surface roughness features have a height gradient. The example of FIGS. 8C-D show surface roughness features 804 having gradients of both pillar height and hole depth.

Figure 9:
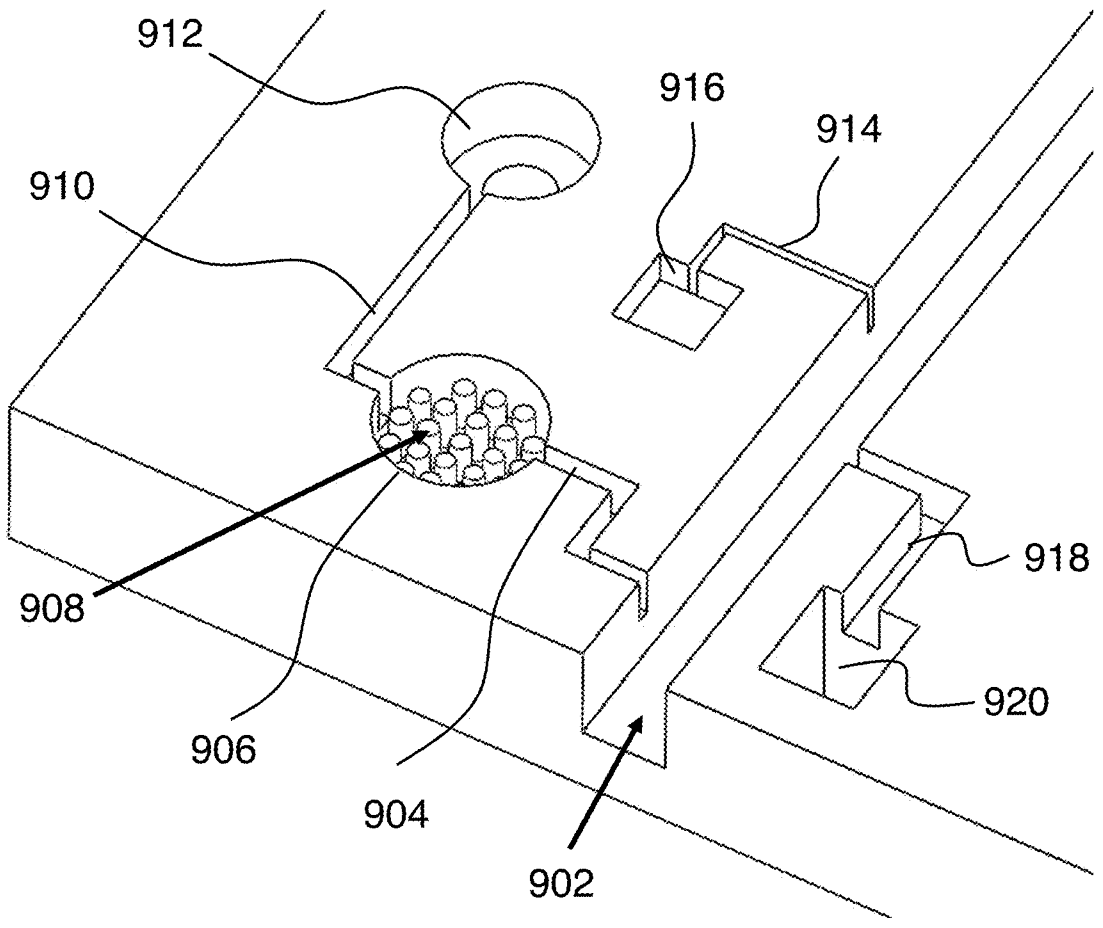
FIG. 9 is a schematic conceptual diagram of a microfluidic "lab on a chip" that may be enabled by the present work.

FIG. 9 is an example of a microfluidic lab on a chip that may be enabled by the advanced fabrication capability described above. Here 902 is a main channel, and three side channel configurations are shown. The first configuration includes side channel 904, chamber 906 including surface roughness 908, side channel 910 and chamber 912. The second configuration includes side channel 914 and chamber 916. The third configuration includes side channel 918 and chamber 920. Applications of such structures can include microfluidics, bio-microfluidics, particle trapping, particle sorting, sensing (fluid and/or particle), and analysis (fluid and/or particle). More specifically, structures as shown here can be useful for: vapor venting during 2-phase flows, suppressing instabilities, making through etched flow conduits in one go along with other features, and making conduits for measurements (such as a pressure transducer).

Figure 10A:
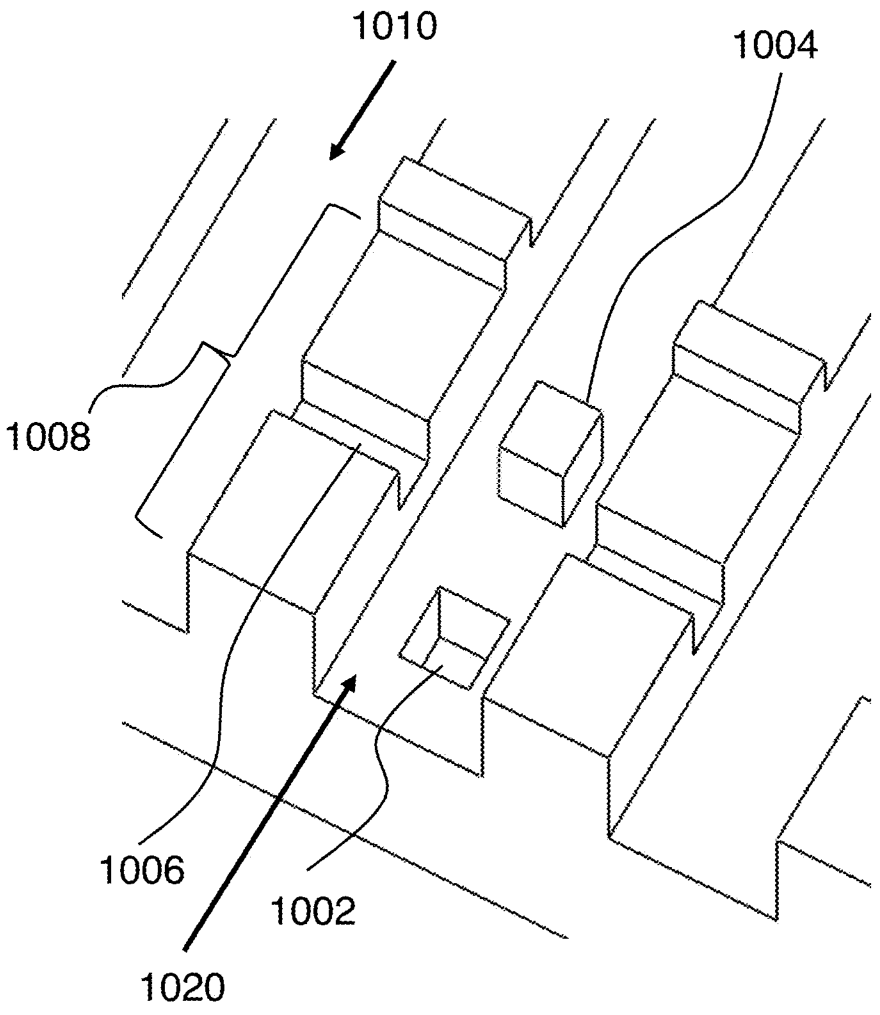
FIGS. 10A-B show an example of a microchannel structure having both a pillar and a well in the path of the channel.
Figure 10B:
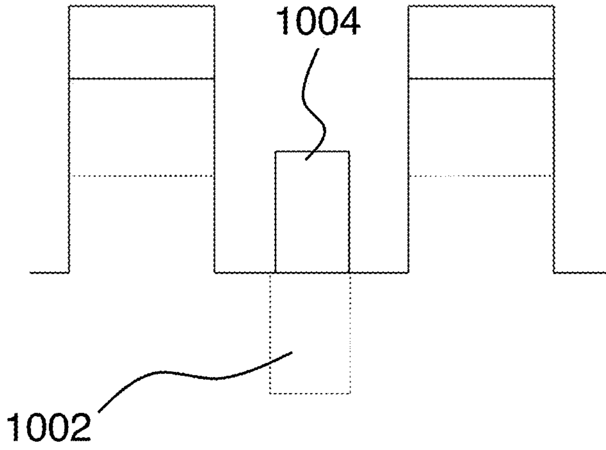

The example of FIGS. 10A-B shows adjacent channels 1010 and 1020 connected by a narrow and deep side channel 1006 and also by a shallow and wide side channel 1008. The example of this figure shows the deep side channel 1006 disposed within the shallow side channel 1008, but it is also possible for the shallow and deep side channels to connect channels 1010 and 1020 in any other configuration, such as the shallow and deep side channels being separated from each other. Another feature of this example is a pillar 1004 and a hole (or pocket) 1002 disposed along the length of channel 1020. Pockets (extruded) and holes (etched) can be made simultaneously on any level of the multi-level structure.

Figure 10C:
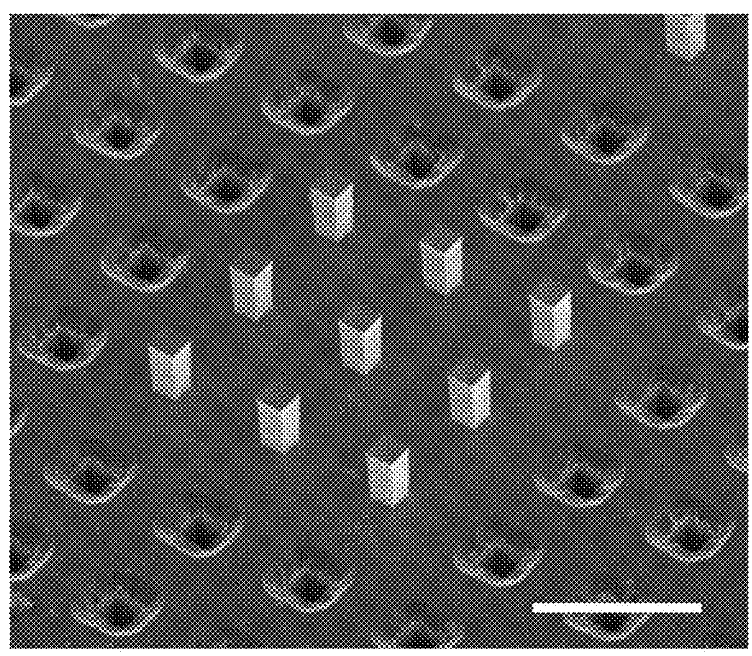
FIGS. 10C-D show exemplary images of multi-level microchannel structures.
Figure 10D:
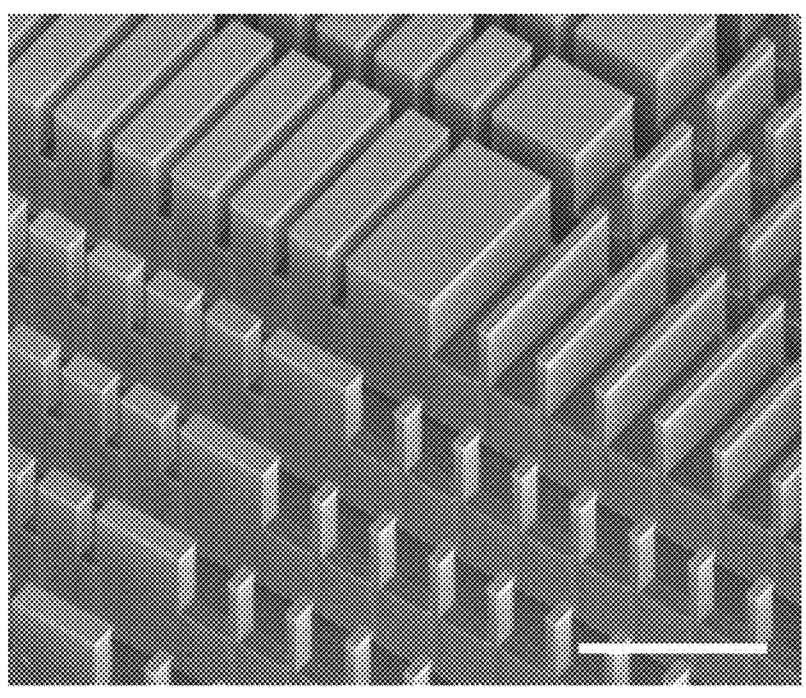

FIG. 10C is an image of a fabricated multi-level structure having both pillars and holes. FIG. 10D is an image showing main channels connected to each other with side channels of various widths and depths.

Figure 11A:
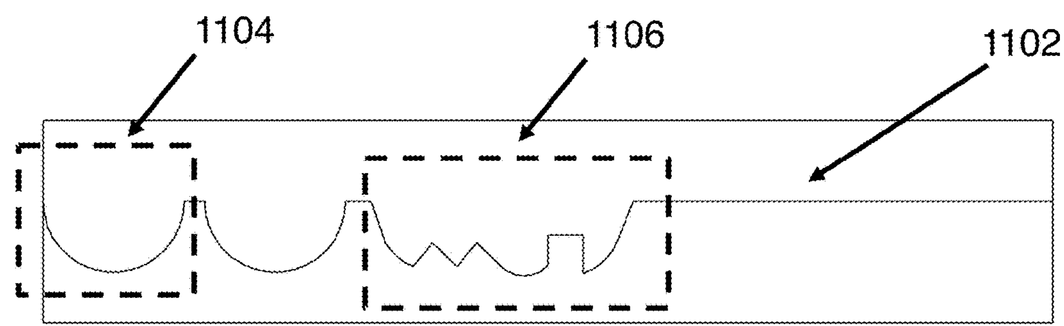
FIGS. 11A-B show an example of providing an arbitrary depth profile along the length of a microchannel, which can be used to better match the channel to expected fluid flow patterns.
Figure 11B:
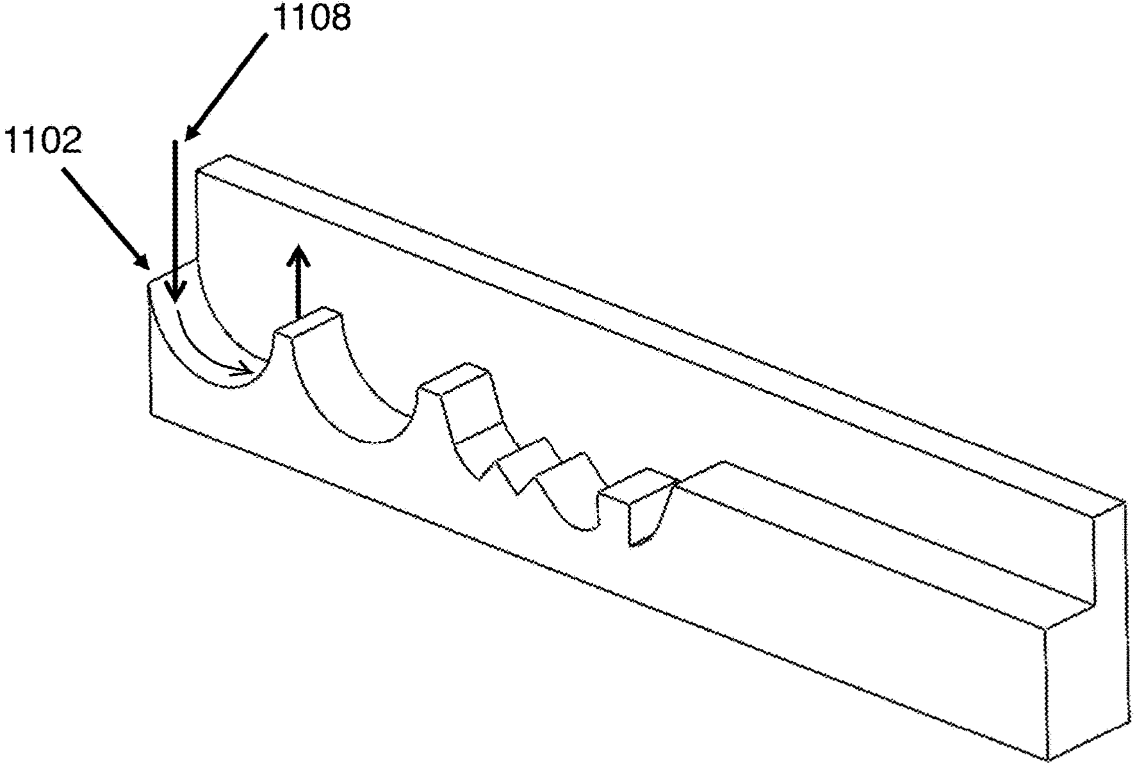

The example of FIGS. 11A-B shows a channel having a channel bottom 1102 that has a depth that varies arbitrarily along its length (e.g., 1104 and, more generally, 1106). Deep multi-level lithography as considered above can provide discrete approximations to such shapes which may be sufficiently close to the desired shapes. Such deep multi-level lithography can optionally be supplemented by gray scale lithography or the like to provide better approximations to continuous depth profiles. In one application of this capability, channel depth 1104 can be designed to match the expected fluid flow stream line 1108, thereby improving fluid flow by eliminating "dead zones" of low fluid flow rate that are often seen in rectangular geometries with corners and the like.

3D flow coolers are becoming increasingly popular nowadays where a manifold layer is used along with the Cold Plate channels to route the fluid in 3D in the cold plate. In such situations fluid follows a u-bend shaped flow streamline as it enters and leaves the Cold Plate channels. In straight microchannel situation, there are sections of Cold Plate channel where the flow stagnates—these zones are characterized by low fluid velocity and hot recirculating fluid, thus locally deteriorating the convective cooling performance. To mitigate this effect, we can design smooth U-shaped contour in the Cold Plate that follows the streamline. This will eliminate the stagnated recirculating fluid, and enhance solid liquid contact surface area in the Cold Plate, thus improving thermal performance.

The invention claimed is:

1. A microchannel structure comprising:

a monolithically microfabricated array of channel features, wherein the monolithically microfabricated array of channel features includes a silicon substrate and silicon features having two or more different vertical feature heights above the substrate;

wherein the monolithically microfabricated array of channel features does not include any wafer-to-wafer bonds;

wherein the two or more different vertical feature heights include at least one vertical feature height of 150 microns or more;

wherein the monolithically microfabricated array of channel features includes at least one channel having a bottom channel surface with a nonuniform vertical height that varies along a length of the at least one channel.

2. The microchannel structure of claim 1, wherein the microchannel structure includes one or more fluid flow structures selected from the group consisting of: channels, pockets, particle traps, vapor vents, and sensor conduits.

3. The microchannel structure of claim 1, wherein the microchannel structure includes two or more primary channels connected via secondary channels.

4. The microchannel structure of claim 1, wherein at least one channel of the microchannel structure has stepwise tapered side walls.

5. The microchannel structure of claim 1, wherein at least one channel of the microchannel structure has a channel depth that varies along its length.

6. The microchannel structure of claim 1, wherein the microchannel structure includes lithographically defined surface roughness.

7. The microchannel structure of claim 6, wherein the lithographically defined surface roughness is present at two or more vertical levels of the microchannel structure.

8. The microchannel structure of claim 6, wherein the lithographically defined surface roughness includes pillars.

9. The microchannel structure of claim 6, wherein the lithographically defined surface roughness includes holes.

10. The microchannel structure of claim 6, wherein the lithographically defined surface roughness includes multilevel features.

11. The microchannel structure of claim 6, wherein the lithographically defined surface roughness features are configured as an array of surface roughness features having two or more vertical heights above a base surface of the surface roughness features.

12. An active cooling heat sink device including the microchannel structure of claim 1.

* * * * *